(12) United States Patent
Masuko et al.

(10) Patent No.: US 8,258,017 B2
(45) Date of Patent: Sep. 4, 2012

(54) PHOTOSENSITIVE ADHESIVE

(75) Inventors: Takashi Masuko, Tsukuba (JP);
Takashi Kawamori, Tsukuba (JP);
Kazuyuki Mitsukura, Tsukuba (JP);
Shigeki Katogi, Tsukuba (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 12/745,592

(22) PCT Filed: Dec. 2, 2008

(86) PCT No.: PCT/JP2008/071882
§ 371 (c)(1),
(2), (4) Date: Nov. 1, 2010

(87) PCT Pub. No.: WO2009/072492
PCT Pub. Date: Jun. 11, 2009

(65) Prior Publication Data
US 2011/0045639 A1  Feb. 24, 2011

(30) Foreign Application Priority Data
Dec. 4, 2007 (JP) ................................. P2007-313886

(51) Int. Cl.
*H01L 21/44* (2006.01)
*H01L 21/48* (2006.01)
*H01L 21/50* (2006.01)
*H01L 21/46* (2006.01)

(52) U.S. Cl. ........................................ 438/118; 438/458

(58) Field of Classification Search .................. 438/118, 438/458; 257/E21.499
See application file for complete search history.

(56) References Cited

U.S. PATENT DOCUMENTS

| 5,677,393 A | 10/1997 | Ohmori et al. |
| 7,250,310 B1 * | 7/2007 | Weaver et al. .................. 438/14 |
| 2007/0045836 A1 * | 3/2007 | Kwon et al. .................. 257/734 |

FOREIGN PATENT DOCUMENTS

| JP | 10-27827 | 1/1998 |
| JP | 11-024257 | 1/1999 |
| JP | 2000-290501 | 10/2000 |
| JP | 2001-329233 | 11/2001 |
| JP | 2004-022996 | 1/2004 |
| JP | 3999840 | 8/2007 |
| TW | 200415749 | 8/2004 |
| WO | 2004/070826 A1 | 8/2004 |
| WO | 2007/004569 | 1/2007 |

OTHER PUBLICATIONS

WO 2007004569 A1 Derwent Summary in English.*
International Search Report issued in corresponding application No. PCT/JP2008/071882, completed Mar. 2, 2009 and mailed Mar. 17, 2009.

(Continued)

*Primary Examiner* — William M. Brewster
(74) *Attorney, Agent, or Firm* — Griffin & Szipl, P.C.

(57) ABSTRACT

A photosensitive adhesive capable of alkali development, the photosensitive adhesive exhibiting adhesion property for an adherend after it has been patterned by light exposure and development, the photosensitive adhesive being used in a method for producing a semiconductor device 100 comprising a step of patterning the photosensitive adhesive 1 provided on a circuit surface of a semiconductor chip 20 by light exposure and development; and a step of directly bonding another semiconductor chip 21 to the patterned photosensitive adhesive 1.

9 Claims, 7 Drawing Sheets

OTHER PUBLICATIONS

English translation of the International Preliminary Report on Patentability issued in related application No. PCT/JP2008/071883.

English translation of the International Preliminary Report on Patentability issued in corresponding application No. PCT/JP2008/071882.

Office Action issued in corresponding Chinese patent application 200880117162.6 on Oct. 25, 2011 (no translation available; submitted for certification).

Office Action issued on Jun. 4, 2012 in a counterpart Taiwanese application 097147133 (no translation available; submitted for certification).

* cited by examiner

Fig.1
(a)
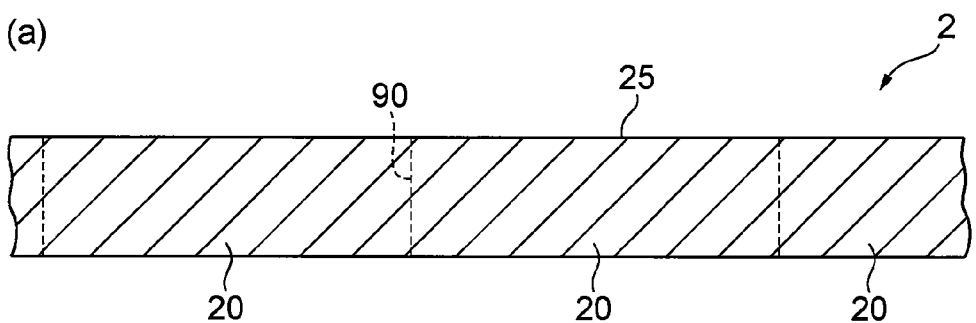
(b)
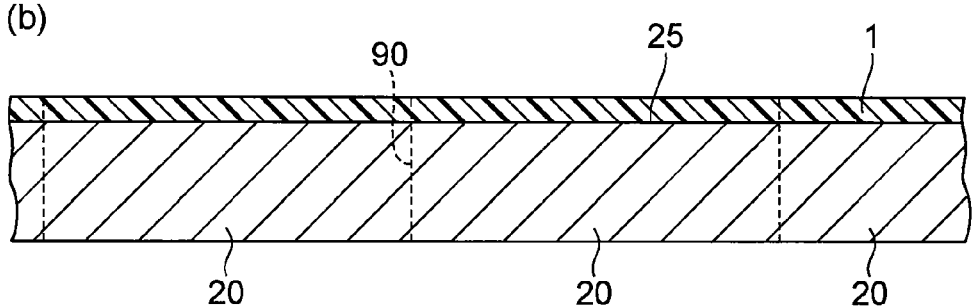
(c)
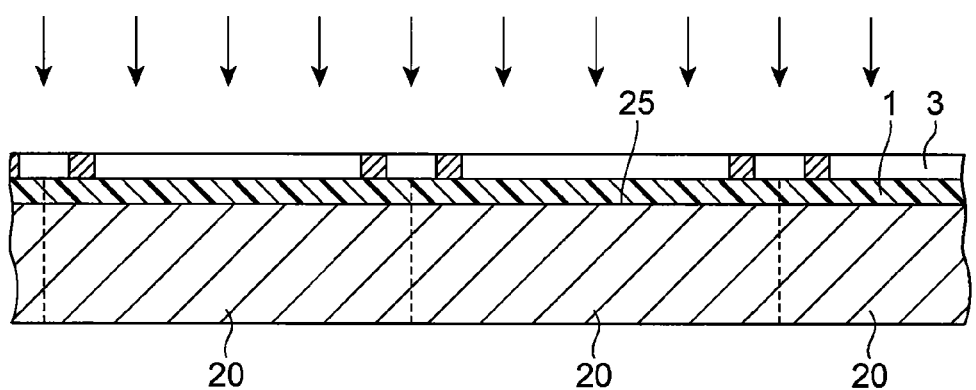

*Fig.2*
(a)
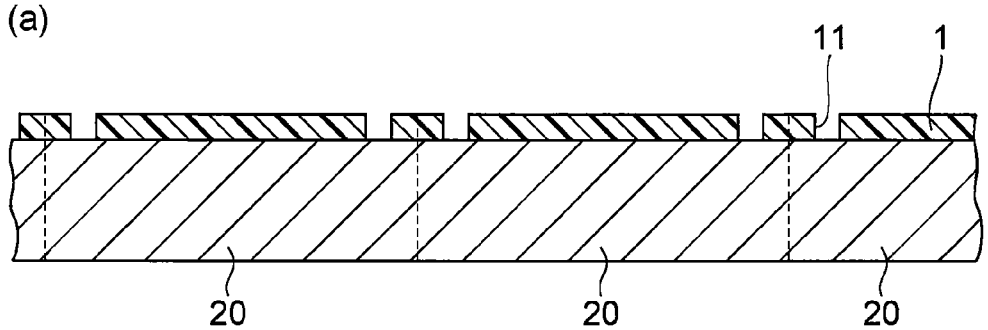
(b)
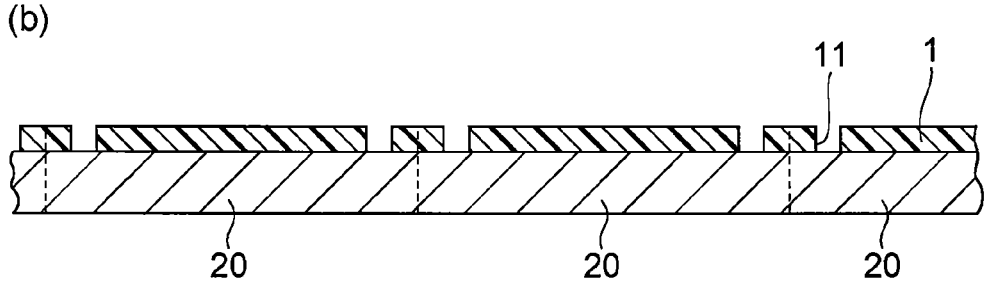
(c)
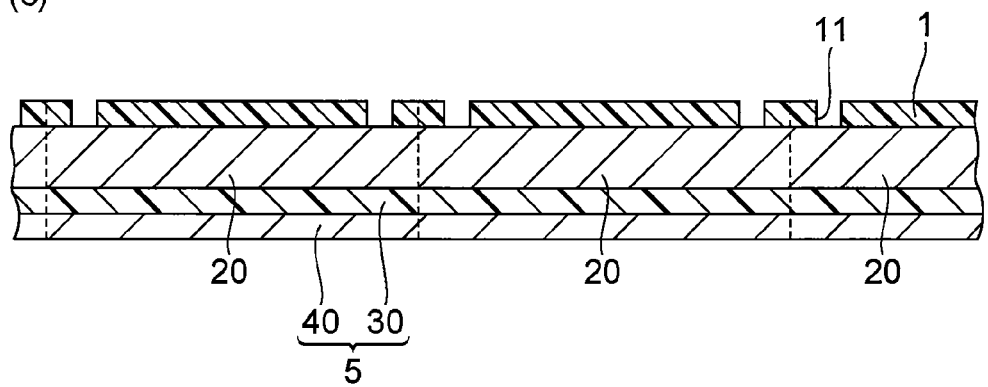

Fig.5
(a)
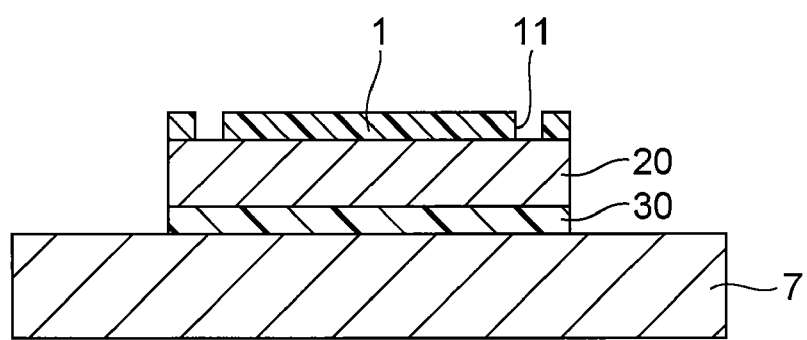
(b)
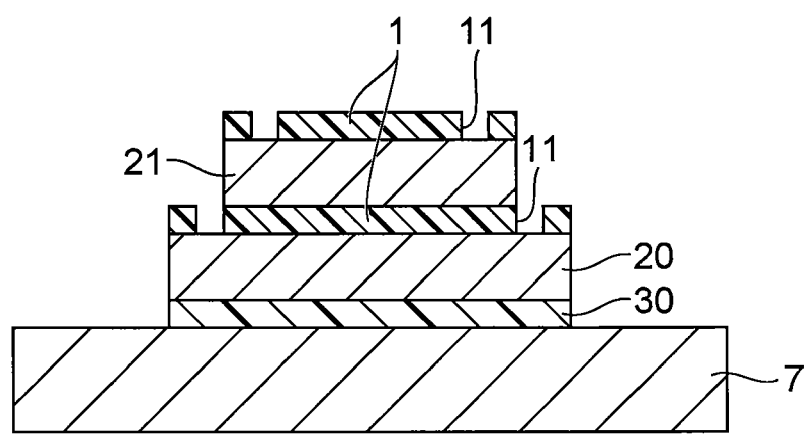

Fig.7
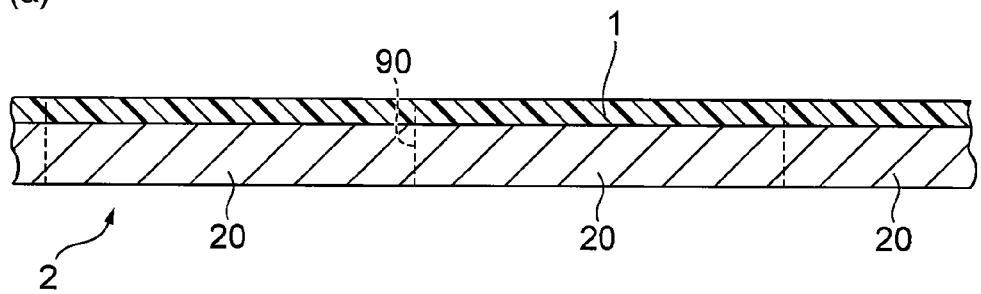
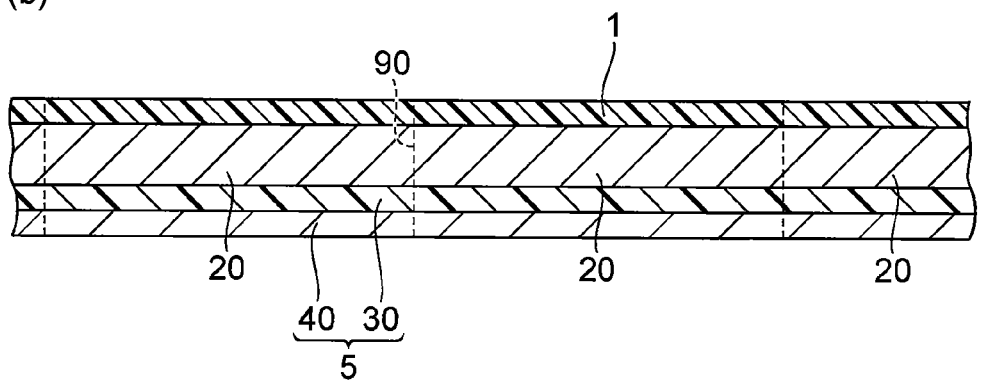
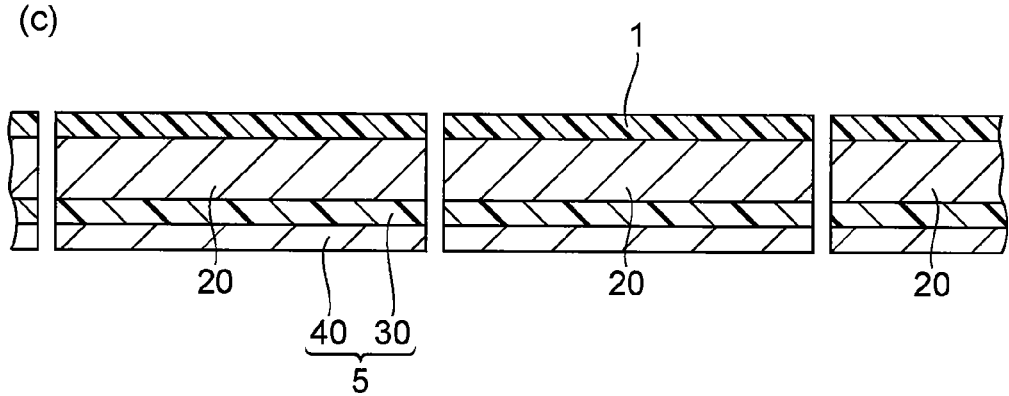

PHOTOSENSITIVE ADHESIVE

This is a National Phase Application in the United States of International Patent Application No. PCT/JP2008/071882 filed Dec. 2, 2008, which claims priority on Japanese Patent Application No. P2007-313886, filed Dec. 7, 2007. The entire disclosures of the above patent applications are hereby incorporated by reference.

TECHNICAL FIELD

The present invention relates to a photosensitive adhesive.

BACKGROUND ART

In semiconductor devices with a multilayer structure obtained by layering a plurality of semiconductor chips, the semiconductor chips are usually bonded together using a die bonding adhesive. It is desired that the adhesive has a combination of properties including a low-stress property, low temperature attachability, moisture-proof reliability and solder reflow resistance.

In production of a semiconductor device with a multilayer structure, it is common to bond semiconductor chips together by situating a die bonding adhesive between a buffer coat film formed on a circuit surface of a semiconductor chip as a lower layer, and a semiconductor chip positioned on that upper layer. The buffer coat film of the semiconductor chip is patterned using a photosensitive resin, so that openings are formed where the bonding pads are exposed.

Also, several photosensitive adhesives having both photosensitivity and adhesion property have been proposed (see Patent documents 1-3).
[Patent document 1] Japanese Unexamined Patent Publication No. 2000-290501
[Patent document 2] Japanese Unexamined Patent Publication No. 2001-329233
[Patent document 3] Japanese Unexamined Patent Publication HEI No. 11-24257

DISCLOSURE OF THE INVENTION

Problems to be Solved by the Invention

While ever smaller thicknesses are desired for semiconductor devices with multilayer structures, it has been difficult to achieve further thickness reduction by conventional methods. In addition, increasing the number of layers of semiconductor chips has led to more steps and thus a more complex production process. Furthermore, in a semiconductor device with a multilayer structure obtained by layering a plurality of semiconductor chips, as described above, the layer structure between the semiconductor chips is a double layer composed of the die bonding layer and buffer coat layer, and therefore the reliability of the semiconductor device has been reduced when either the interfacial adhesion property between them is insufficient or stress is created by differences in their thermal strains.

It is therefore an object of the present invention to permit further thickness reduction of semiconductor devices with multilayer structures, while reducing the number of steps in the semiconductor device process. It is another object to improve the reliability of the obtained semiconductor devices.

Means for Solving the Problems

The invention relates to a photosensitive adhesive capable of alkali development, that exhibits adhesion property (re-adhesion property) for an adherend after it has been patterned by light exposure and development. The photosensitive adhesive of the invention is used in a method for producing a semiconductor device comprising a step of patterning the photosensitive adhesive provided on the circuit surface of a semiconductor chip by light exposure and development, and a step of directly bonding another semiconductor chip to the patterned photosensitive adhesive. The patterned photosensitive adhesive may be a buffer coat film. The buffer coat film functions not only for stress relaxation but also as a semiconductor circuit surface protecting film.

The photosensitive adhesive of the invention has both a function as a die bonding adhesive and a function as a photosensitive resin for formation of the patterned insulating resin film. By using a photosensitive adhesive according to the invention, it is possible to further reduce the thickness of semiconductor devices with multilayer structures while reducing the number of steps in semiconductor device production, since there is no need to provide a separate adhesive layer from the insulating resin film on the semiconductor chip. In addition, since the photosensitive adhesive of the invention has, in a single layer, both a function as a die bonding adhesive and a function as a photosensitive resin for formation of a patterned insulating resin film, as mentioned above, the interface between the two conventional layers of the die bonding layer and buffer coat layer is eliminated. This eliminates the problem of peeling due to poor interfacial adhesion property, and the problem of stress resulting from differences in the thermal strains of the two layers. It is thus possible to vastly improve the heat resistance, humidity resistance and connection reliability of the obtained semiconductor device.

The photosensitive adhesive of the invention preferably comprises an alkali-soluble polymer, a radiation-polymerizable compound and a photopolymerization initiator. This will most easily impart adhesion property for adherends to the photosensitive adhesive after it has been patterned by light exposure and development. From the same viewpoint, the alkali-soluble polymer preferably further comprises a carboxyl or phenolic hydroxyl group.

The glass transition temperature of the alkali-soluble polymer is preferably not greater than 150° C. This will allow the photosensitive adhesive to be provided on adherends such as semiconductor wafers or supporting members at lower temperature.

The alkali-soluble polymer is preferably a polyimide. The polyimide is preferably one obtained by reacting a tetracarboxylic dianhydride with a diamine including at least one type of aromatic diamine represented by any of the following chemical formulas (I-a), (I-b), (II-a), (II-b) and (II-c).

[Chemical Formula 1]

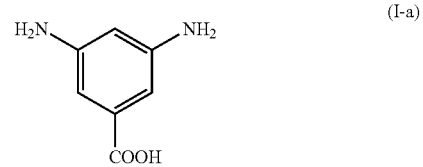

(I-a)

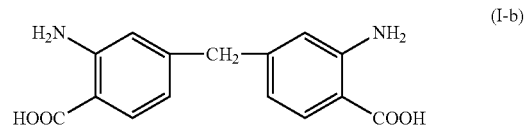

(I-b)

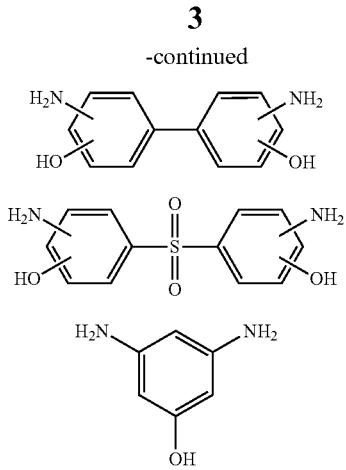

The photosensitive adhesive of the invention preferably further comprises a thermosetting resin.

The photosensitive adhesive may be in the form of a film.

Effect of the Invention

According to the invention it is possible to further reduce the thicknesses of semiconductor devices with multilayer structures. According to the invention it is also possible to reduce the number of steps for semiconductor device production. In addition, the invention can improve the reliability of obtained semiconductor devices.

BRIEF DESCRIPTION OF THE DRAWINGS

FIG. 1 is an end view of an embodiment of a method for producing a semiconductor device.
FIG. 2 is an end view of an embodiment of a method for producing a semiconductor device.
FIG. 5 is an end view of an embodiment of a method for producing a semiconductor device.
FIG. 7 is an end view of an embodiment of a method for producing a semiconductor device.

EXPLANATION OF SYMBOLS

1: Film-like photosensitive adhesive (adhesive film), 2: semiconductor wafer, 5: composite film, 7: support base, 11: opening, 20,21: semiconductor chip, 25: circuit surface, 30: die bonding material, 40: dicing tape, 90: dicing line, 100: semiconductor device.

BEST MODE FOR CARRYING OUT THE INVENTION

Preferred embodiments of the invention will now be described in detail. However, the present invention is not limited to the embodiments described below.

Figure 6:
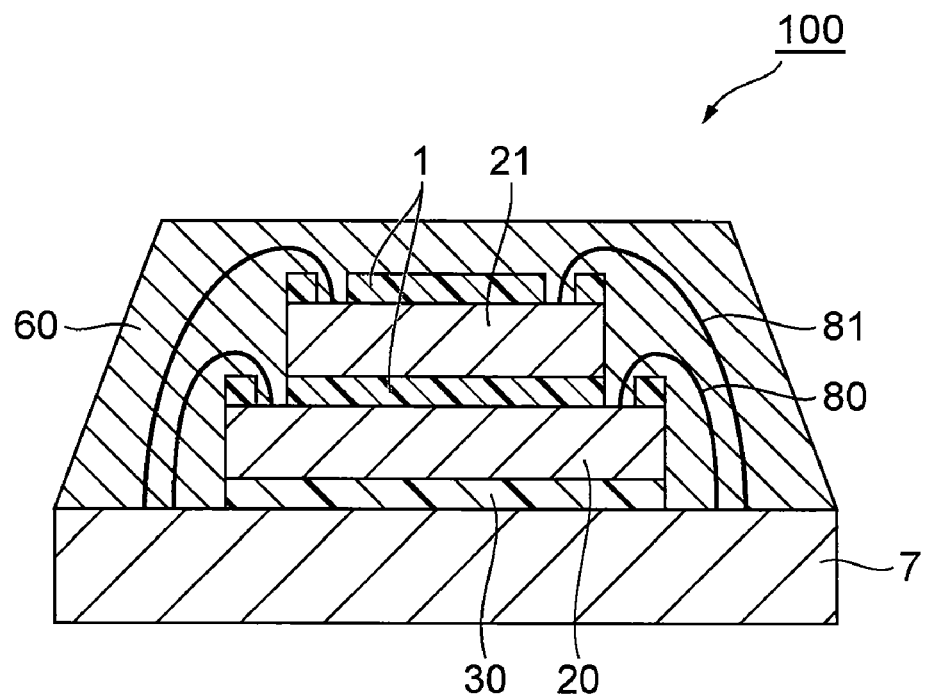
FIG. 6 is an end view of an embodiment of a method for producing a semiconductor device.

FIGS. 1, 2, 3, 4, 5 and 6 are end views or plan views of an embodiment of a method for producing a semiconductor device. The method for producing a semiconductor device according to this embodiment comprises a step of forming a film-like photosensitive adhesive (hereunder also referred to as "adhesive film") 1 on a circuit surface 25 of a semiconductor chip 20 that has been formed on a semiconductor wafer 2 (FIG. 1(a), (b)), a step of patterning the film-like photosensitive adhesive 1 formed on the circuit surface 25 of the semiconductor chip 20 by light exposure and development (FIG. 1(c), FIG. 2(a)), a step of polishing the semiconductor wafer 2 from the side opposite the circuit surface 25 to reduce the thickness of the semiconductor wafer 2 (FIG. 2(b)), a step of cutting the semiconductor wafer 2 into multiple semiconductor chips 20 by dicing (FIG. 2(c), FIG. 4(a)), a step of picking up the semiconductor chips 20 and mounting them on a laminar support base 7 for the semiconductor device (FIG. 4(b), FIG. 5(a)), a step of directly bonding a semiconductor chip 21 as a second layer on the patterned photosensitive adhesive 1 on the circuit surface of the semiconductor chip 20 which has been mounted on the support base 7 (FIG. 5(b)), and a step of connecting each of the semiconductor chips 20,21 to external connecting terminals (FIG. 6).

In the semiconductor wafer 2 shown in FIG. 1(a) there are formed a plurality of semiconductor chips 20 partitioned by the dicing lines 90. The film-like photosensitive adhesive 1 is provided on the surface on the circuit surface 25 side of the semiconductor chip 20 (FIG. 1(b)). A method of preparing the photosensitive adhesive 1 preformed into a film and attaching it onto the semiconductor wafer 2 is convenient. The photosensitive adhesive 1 may be formed by a method of coating a liquid varnish containing the photosensitive adhesive 1 onto a semiconductor wafer 2 by a spin coating method, and heating it to dryness.

The photosensitive adhesive 1 is a negative-type photosensitive adhesive capable of alkali development, that exhibits adhesion property for the adherend after it has been patterned by light exposure and development. More specifically, the resist pattern formed by patterning of the film-like photosensitive adhesive 1 by light exposure and development exhibits adhesion property for adherends, such as the semiconductor chip and board. The resist pattern and the adherends can be bonded by, for example, contact bonding the adherends onto the resist pattern with heating if necessary. The details regarding a photosensitive adhesive with such a function will be explained below.

The photosensitive adhesive 1 laminated on the semiconductor wafer 2 is irradiated with active light rays (typically ultraviolet rays) via a mask 3 having openings formed at prescribed locations (FIG. 1(c)). The photosensitive adhesive 1 is thus exposed to light in the prescribed pattern.

Following light exposure, the sections of the photosensitive adhesive 1 that were not exposed to light are removed by development using an alkali developing solution, thereby the photosensitive adhesive 1 is patterned in a manner so that openings 11 are formed (FIG. 2(a)). A positive photosensitive adhesive may be used instead of a negative one, in which case the sections of the film-like photosensitive adhesive exposed to light are removed by development.

Figure 3:
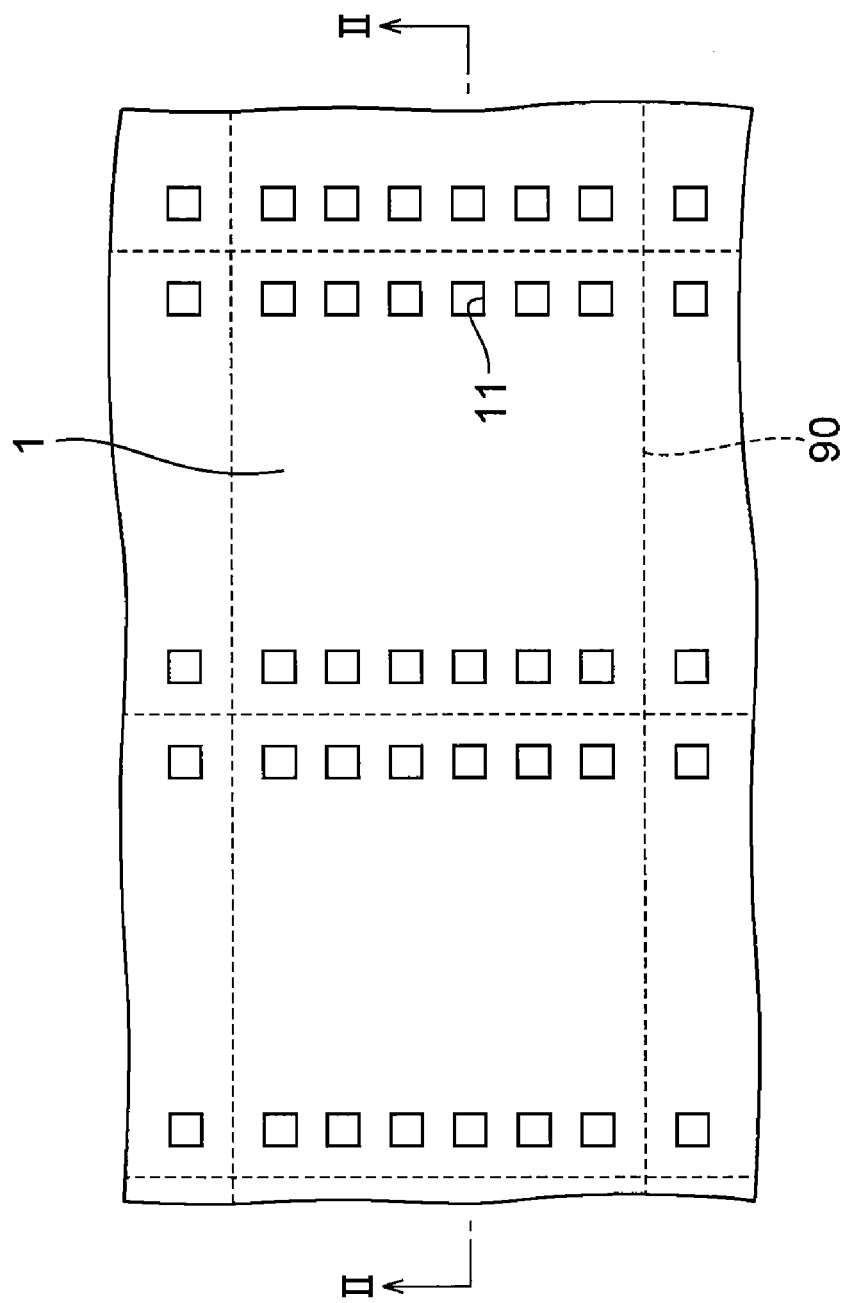
FIG. 3 is a plan view of an embodiment of a method for producing a semiconductor device.
Figure 4:
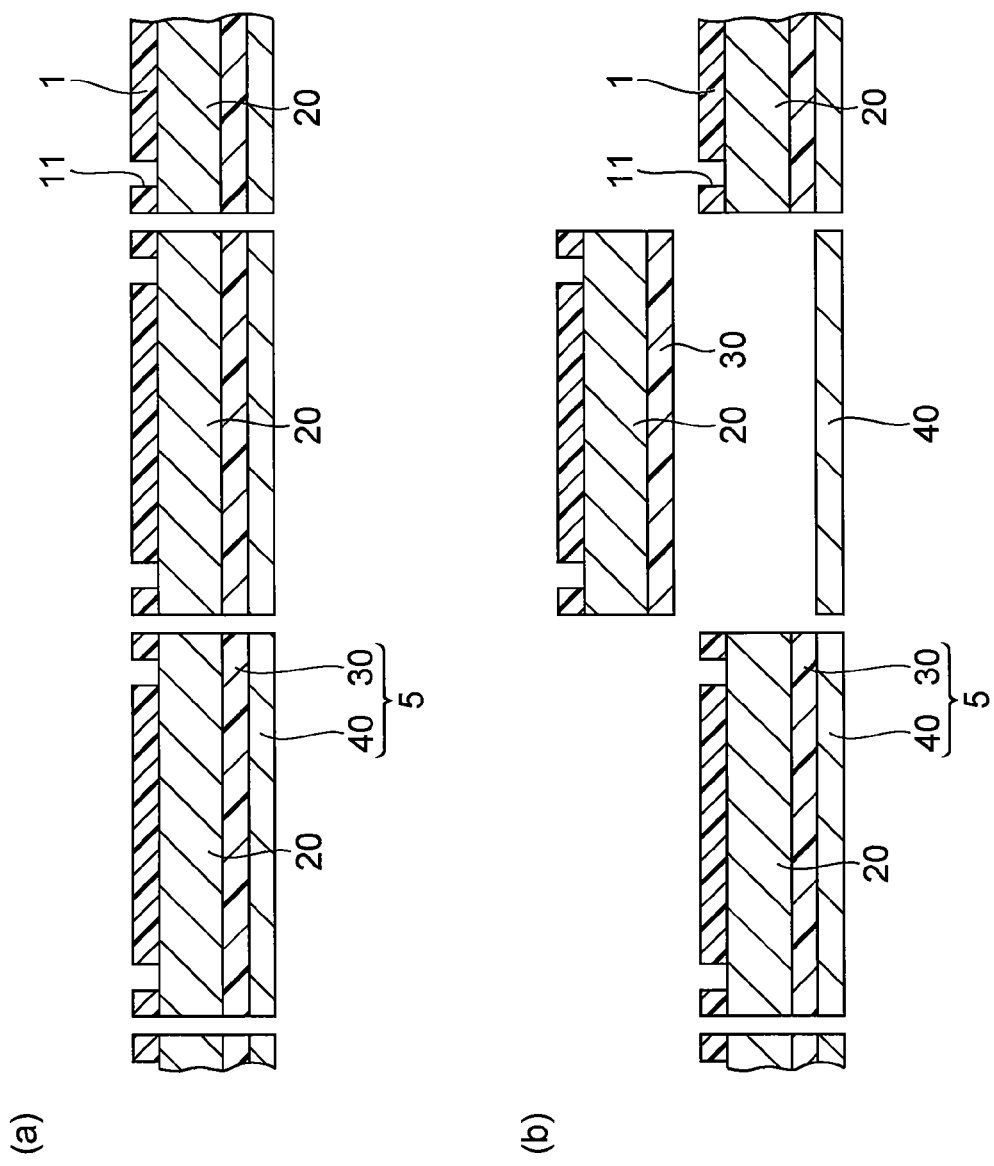
FIG. 4 is an end view of an embodiment of a method for producing a semiconductor device.

FIG. 3 is a plan view showing the patterned state of a photosensitive adhesive 1. The bonding pads of semiconductor chips are exposed at the openings 11. That is, the patterned photosensitive adhesive 1 is the buffer coat film of the semiconductor chip 20. A plurality of rectangular openings 11 are formed in rows on each semiconductor chip 20. The shapes, arrangement and number of openings 11 is not restricted to those of this embodiment, and they may be appropriately modified so that the prescribed sections of the bonding pads are exposed.

After patterning, the side of the semiconductor wafer 2 opposite the photosensitive adhesive 1 side is polished to reduce the thickness of the semiconductor wafer 2 to the prescribed thickness (FIG. 2(b)). The polishing is carried out, for example, by attaching a pressure-sensitive adhesive film onto the photosensitive adhesive 1 and fixing the semiconductor wafer 2 on a polishing jig by the pressure-sensitive adhesive film.

After polishing, a composite film 5 comprising a die bonding material 30 and dicing tape 40, laminated together, is attached to the side of the semiconductor wafer 2 opposite the photosensitive adhesive 1 side, oriented with the die bonding material 30 contacting the semiconductor wafer 2. The attachment is carried out with heating if necessary.

Next, the semiconductor wafer 2 is cut, together with the composite film 5, along the dicing lines 90, thereby the semiconductor wafer 2 is partitioned into multiple semiconductor chips 20 (FIG. 4(a)). The dicing is accomplished using a dicing blade, for example, while the wafer is completely anchored to a frame by the dicing tape 40.

After dicing, the semiconductor chip 20 and the die bonding material 30 attached to back side of the semiconductor chip 20 are both picked up (FIG. 4(b)). The picked up semiconductor chip 20 is mounted on a support base 7 via the die bonding material 30 (FIG. 5(a)).

A second semiconductor chip 21 is directly bonded onto the photosensitive adhesive 1 of the semiconductor chip 20 that has been mounted on the support base 7 (FIG. 5(b)). In other words, the semiconductor chip 20 and the semiconductor chip 21 positioned on upper layer of the semiconductor chip 20 are bonded by the patterned photosensitive adhesive 1 (buffer coat film) lying between them. The semiconductor chip 21 is bonded at a position such that the openings 11 of the patterned photosensitive adhesive 1 are not blocked. The patterned photosensitive adhesive 1 (buffer coat film) is also formed on the circuit surface of the semiconductor chip 21.

Bonding of the semiconductor chip 21 is accomplished by, for example, a method of thermocompression bonding while heating to a temperature at which the photosensitive adhesive 1 exhibits fluidity. After thermocompression bonding, the photosensitive adhesive 1 is heated if necessary to further promote curing.

Next, the semiconductor chip 20 is connected to an external connecting terminal on the support base 7 via a wire 80 connected to its bonding pad, while the semiconductor chip 21 is connected to an external connecting terminal on the support base 7 via a wire 81 connected to its bonding pad. The laminated body comprising a plurality of the semiconductor chips is then sealed with a sealing resin layer 60 to obtain a semiconductor device 100 (FIG. 6).

The method for producing a semiconductor device is not limited to the embodiments described above, and it may incorporate appropriate modifications that still fall within the gist of the invention. For example, the steps of adhesive film attachment, dicing, light exposure and development and semiconductor wafer polishing may be carried out in a different order as appropriate. As shown in FIG. 7, the semiconductor wafer 2 on which the film-like photosensitive adhesive 1 has been attached may be thinned by polishing and then diced. In this case, the photosensitive adhesive 1 is patterned by light exposure and development after dicing, to obtain a laminated body similar to that shown in FIG. 4(a). Alternatively, the semiconductor wafer that has been thinned by polishing may be diced first, before attachment of the film-like photosensitive adhesive 1 and light exposure and development thereof. Also, three or more semiconductor chips may be laminated, in which case at least one pair of adjacent semiconductor chips is directly bonded by the patterned photosensitive adhesive (the buffer coat film on the lower layer side).

A preferred embodiment of a photosensitive adhesive used in the method for producing a semiconductor device according to the embodiment described above will now be explained.

The photosensitive adhesive of this embodiment is a negative-type photosensitive resin comprising an alkali-soluble polymer, a radiation-polymerizable compound and a photopolymerization initiator.

The alkali-soluble polymer need only be soluble in alkali developing solutions, but it is preferably soluble in tetramethylammonium hydride aqueous solution. Most polymers with carboxyl and/or phenolic hydroxyl groups, for example, have good solubility in alkali developing solutions.

In order to ensure satisfactory adhesion after light exposure, the glass transition temperature (Tg) of the alkali-soluble polymer is preferably 10-150° C. If the Tg of the alkali-soluble polymer is below 10° C., voids will tend to be produced more easily during thermocompression bonding after light exposure. If the Tg is above 150° C., the temperature for attachment onto the adherend before light exposure and the contact bonding temperature after light exposure will be increased, tending to result in warping due to thermal damage or thermal stress on peripheral members. The Tg is the tan δ peak temperature when temperature changes in the viscoelasticity of the film-like photosensitive adhesive are measured using a viscoelasticity measuring apparatus (by Rheometrix).

The weight-average molecular weight of the alkali-soluble polymer is preferably 5000-150000, more preferably 10000-100000 and even more preferably 10000-50000. If the weight-average molecular weight of the alkali-soluble polymer is less than 5000, the film formability of the photosensitive adhesive will tend to be reduced, while if it is greater than 150000, the solubility in alkali developing solutions will tend to be lower and the developing time lengthened. A weight-average molecular weight of 5000-150000 for the alkali-soluble polymer will produce an effect that allows satisfactory hot flow properties to be ensured for re-adhesion after light exposure. The weight-average molecular weight referred to above is the value based on standard polystyrene, measured using high-performance liquid chromatography (for example, "C-R4A", trade name of Shimadzu Corp.).

The alkali-soluble polymer may also contain a radiation-polymerizable functional group such as an ethylenic unsaturated group. This will allow the alkali-soluble polymer to also function as a radiation-polymerizable compound. Radiation-polymerizable compounds may include only alkali-soluble polymers with radiation-polymerizable functional groups, but it may include combinations of such alkali-soluble polymers with different radiation-polymerizable compounds.

An alkali-soluble polymer is preferably one containing one or more polymers selected from the group consisting of polyimides, polyamideimides, polyamides, polybenzooxazoles, acrylic polymers, styrene-maleic acid copolymers, vinyl compound-maleimide compound copolymers, novolac resins and polynorbornane resins. Polyimides, polyamideimides, polyamides, polybenzooxazoles and acrylic polymers are preferred among these.

A polyimide used as an alkali-soluble polymer is composed of one or more polymers having an imide backbone in the main chain. The polyimide preferably has a carboxyl and/or phenolic hydroxyl group.

A polyimide with a carboxyl group can be obtained by reacting trimellitic anhydride, and/or a tetracarboxylic dianhydride, with a diamine containing carboxyl and amino groups. A polyimide with a phenolic hydroxyl group can be obtained by reacting a tetracarboxylic dianhydride with a diamine containing phenolic hydroxyl and amino groups. Such reaction will introduce the carboxyl or phenolic hydroxyl group of the diamine into the polyimide. The type of diamine and its charging ratio and the reaction conditions may be appropriately adjusted to control the acid value of the polyimide to the desired range.

The reaction between the tetracarboxylic dianhydride and diamine (condensation reaction) may be carried out by a method known to those skilled in the art. In the reaction, for example, first the tetracarboxylic dianhydride and diamine are subjected to addition reaction in an organic solvent at an equimolar ratio or approximately equimolar ratio, at a reaction temperature of not greater than 80° C. and preferably 0-60° C. The components may be added in any desired order. The viscosity of the reaction mixture will gradually increase as the reaction proceeds, forming polyamide acid as the polyimide precursor. The produced polyamide acid is heated to a temperature of 50-80° C. for depolymerization to adjust the molecular weight. The produced polyamide acid is then subjected to dehydrating cyclization to yield a polyimide. Dehydrating cyclization can be accomplished by thermal cyclization using heat treatment or by chemical cyclization using a dehydrating agent.

More specifically, the charging ratio of the tetracarboxylic dianhydride and diamine is a total amount of preferably 0.5-2.0 mol and more preferably 0.8-1.0 mol for the diamine with respect to 1.0 mol as the total amount of tetracarboxylic dianhydride. If the diamine ratio exceeds 2.0 mol, more polyimide oligomers with terminal amino groups will tend to be generated, while if it is below 0.5 mol, more polyimide oligomers with terminal carboxylic acid or acid anhydride groups will tend to be generated. An increased proportion of such polyimide oligomers will lower the weight-average molecular weight of the polyimide and tend to impair the properties including the heat resistance of the photosensitive adhesive composition. Regulation of the charging ratio will allow the weight-average molecular weight of the polyimide to be adjusted to within 5000-150000.

The diamine used for synthesis of the polyimide is preferably at least one aromatic diamine represented by formula (I-a), (I-b), (II-a), (II-b) or (II-c) above, for particularly satisfactory solubility in alkali developing solutions.

In order to lower the Tg of the polyimide to reduce thermal stress, the diamine preferably further comprises an aliphatic etherdiamine represented by the following general formula (III). In formula (III), $Q^1$, $Q^2$ and $Q^3$ each independently represent a C1-10 alkylene group, and $n_1$ represents an integer of 1-80.

[Chemical Formula 2]

$$H_2N-Q^1-O-(Q^2-O)_{n_1}-Q^3-NH_2 \quad (III)$$

As aliphatic etherdiamines of formula (III) there may be mentioned, more specifically, compounds represented by chemical formula (IIIa), (IIIb) and (IIIc). Of these, aliphatic etherdiamines of formula (IIIa) are preferred from the standpoint of increasing the attachment property at low temperature before light exposure and the re-adhesion property after light exposure.

[Chemical Formula 3]

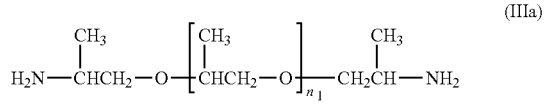

(IIIa)

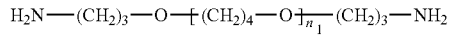

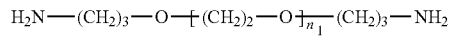

As examples of commercially available aliphatic etherdiamines there may be mentioned JEFFAMINE D-230, D-400, D-2000, D-4000, ED-600, ED-900, ED-2001 and EDR-148 (all trade names) by San Techno Chemical Co., Ltd., and Polyetheramine D-230, D-400 and D-2000 (all trade names) by BASF.

In order to ensure satisfactory adhesion property to adherends after light exposure, it is preferred to use a siloxanediamine represented by the following general formula (IV). In formula (IV), $R^1$ and $R^2$ each independently represent a C1-5 alkylene or optionally substituted phenylene group, $R^3$, $R^4$, $R^5$ and $R^6$ each independently represent a C1-5 alkyl, phenyl or phenoxy group, and $n_2$ represents an integer of 1-5.

[Chemical Formula 4]

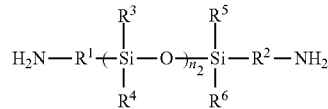

(IV)

As examples of siloxanediamines represented by chemical formula (IV), where $n_2$ is 1, there may be mentioned 1,1,3,3-tetramethyl-1,3-bis(4-aminophenyl)disiloxane, 1,1,3,3-tetraphenoxy-1,3-bis(4-aminoethyl)disiloxane, 1,1,3,3-tetraphenyl-1,3-bis(2-aminoethyl)disiloxane, 1,1,3,3-tetraphenyl-1,3-bis(3-aminopropyl)disiloxane, 1,1,3,3-tetramethyl-1,3-bis(2-aminoethyl)disiloxane, 1,1,3,3-tetramethyl-1,3-bis(3-aminopropyl)disiloxane, 1,1,3,3-tetramethyl-1,3-bis(3-aminobutyl)disiloxane and 1,3-dimethyl-1,3-dimethoxy-1,3-bis(4-aminobutyl)disiloxane. As examples where $n_2$ is 2, there may be mentioned 1,1,3,3,5,5-hexamethyl-1,5-bis(4-aminophenyl)trisiloxane, 1,1,5,5-tetraphenyl-3,3-dimethyl-1,5-bis(3-aminopropyl)trisiloxane, 1,1,5,5-tetraphenyl-3,3-dimethoxy-1,5-bis(4-aminobutyl)trisiloxane, 1,1,5,5-tetraphenyl-3,3-dimethoxy-1,5-bis(5-aminopentyl)trisiloxane, 1,1,5,5-tetramethyl-3,3-dimethoxy-1,5-bis(2-aminoethyl)trisiloxane, 1,1,5,5-tetramethyl-3,3-dimethoxy-1,5-bis(4-aminobutyl) trisiloxane, 1,1,5,5-tetramethyl-3,3-dimethoxy-1,5-bis(5-aminopentyl)trisiloxane, 1,1,3,3,5,5-hexamethyl-1,5-bis(3-aminopropyl)trisiloxane, 1,1,3,3,5,5-hexaethyl-1,5-bis(3-aminopropyl)trisiloxane and 1,1,3,3,5,5-hexapropyl-1,5-bis(3-aminopropyl)trisiloxane.

These diamines may be used alone or in combinations of two or more. For example, preferably at least one aromatic diamine represented by formula (Ia), (Ib), (II-a), (II-b) or (II-c) is used at 10-50 mol % of the total diamines, a siloxanediamine represented by general formula (IV) is used at 1-20 mol % (even more preferably 5-10 mol %) of the total diamines, and an aliphatic etherdiamine represented by general formula (III) is used at 10-90 mol % of the total diamines. An aromatic diamine represented by formula (Ia) or (Ib) may be used in this proportion to ensure a satisfactory developing property. If the siloxanediamine is used at less than 1 mol % of the total diamines, the adhesion property for adherends after light exposure will tend to be reduced, and if it exceeds 20 mol %, the solubility in alkali developing solutions will tend to be reduced. If the aliphatic etherdiamine is used at less than 10 mol % of the total diamines, the Tg of the polyimide will be increased and the low-temperature workability (attachment property at low temperature) will tend to be reduced, while if it exceeds 90 mol %, voids will tend to be generated more easily due to excess flow during thermocompression bonding after light exposure.

The diamine component may further include a diamine other than those mentioned above. As examples there may be mentioned o-phenylenediamine, m-phenylenediamine, p-phenylenediamine, 3,3'-diaminodiphenyl ether, 3,4'-diaminodiphenyl ether, 4,4'-diaminodiphenyl ether, 3,3'-diaminodiphenylmethane, 3,4'-diaminodiphenylmethane, 4,4'-diaminodiphenylether methane, bis(4-amino-3,5-dimethylphenyl)methane, bis(4-amino-3,5-diisopropylphenyl)methane, 3,3'-diaminodiphenyldifluoromethane, 3,4'-diaminodiphenyldifluoromethane, 4,4'-diaminodiphenyldifluoromethane, 3,3'-diaminodiphenylsulfone, 3,4'-diaminodiphenylsulfone, 4,4'-diaminodiphenylsulfone, 3,3'-diaminodiphenyl sulfide, 3,4'-diaminodiphenyl sulfide, 4,4'-diaminodiphenyl sulfide, 3,3'-diaminodiphenylketone, 3,4'-diaminodiphenylketone, 4,4'-diaminodiphenylketone, 2,2-bis(3-aminophenyl)propane, 2,2'-(3,4'-diaminodiphenyl)propane, 2,2-bis(4-aminophenyl)propane, 2,2-bis(3-aminophenyl)hexafluoropropane, 2,2-(3,4'-diaminodiphenyl)hexafluoropropane, 2,2-bis(4-aminophenyl)hexafluoropropane, 1,3-bis(3-aminophenoxy)benzene, 1,4-bis(3-aminophenoxy)benzene, 1,4-bis(4-aminophenoxy)benzene, 3,3'-(1,4-phenylenebis(1-methylethylidene))bisaniline, 3,4'-(1,4-phenylenebis(1-methylethylidene))bisaniline, 4,4'-(1,4-phenylenebis(1-methylethylidene))bisaniline, 2,2-bis(4-(3-aminophenoxy)phenyl)propane, 2,2-bis(4-(3-aminophenoxy)phenyl)hexafluoropropane, 2,2-bis(4-(4-aminophenoxy)phenyl)hexafluoropropane, bis(4-(3-aminophenoxy)phenyl)sulfide, bis(4-(4-aminophenoxy)phenyl)sulfide, bis(4-(3-aminophenoxy)phenyl)sulfone, bis(4-(4-aminophenoxy)phenyl)sulfone, 1,3-bis(aminomethyl)cyclohexane and 2,2-bis(4-aminophenoxyphenyl)propane.

A tetracarboxylic dianhydride used as a starting material for synthesis of the polyimide is preferably purified by recrystallization from acetic anhydride in order to limit reduction in the properties of the adhesive. Alternatively, the tetracarboxylic dianhydride may be dried by heating for 12 hours or longer at a temperature 10-20° C. lower than its melting point. The purity of the tetracarboxylic dianhydride can be evaluated by the difference between the endothermic starting temperature and the endothermic peak temperature as measured with a differential scanning calorimeter (DSC), and preferably a tetracarboxylic dianhydride purified by recrystallization or drying so that the difference is not greater than 20° C. and more preferably not greater than 10° C. is used for synthesis of the polyimide. The endothermic starting temperature and endothermic peak temperature are measured using a DSC (Model DSC-7 by Perkin-Elmer), under conditions with a sample amount of 5 mg, a temperature-elevating rate of 5° C./min and a measuring atmosphere of nitrogen.

As examples of tetracarboxylic dianhydrides there may be mentioned pyromellitic acid dianhydride, 3,3',4,4'-biphenyltetracarboxylic dianhydride, 2,2',3,3'-biphenyltetracarboxylic dianhydride, 2,2-bis(3,4-dicarboxyphenyl)propane dianhydride, 2,2-bis(2,3-dicarboxyphenyl)propane dianhydride, 1,1-bis(2,3-dicarboxyphenyl)ethane dianhydride, 1,1-bis(3,4-dicarboxyphenyethane dianhydride, bis(2,3-dicarboxyphenyl)methane dianhydride, bis(3,4-dicarboxyphenyl)methane dianhydride, bis(3,4-dicarboxyphenyl)sulfone dianhydride, 3,4,9,10-perylenetetracarboxylic dianhydride, bis(3,4-dicarboxyphenypether dianhydride, benzene-1,2,3,4-tetracarboxylic dianhydride, 3,4,3',4'-benzophenonetetracarboxylic dianhydride, 2,3,2',3'-benzophenonetetracarboxylic dianhydride, 3,3,3',4'-benzophenonetetracarboxylic dianhydride, 1,2,5,6-naphthalenetetracarboxylic dianhydride, 1,4,5,8-naphthalenetetracarboxylic dianhydride, 2,3,6,7-naphthalenetetracarboxylic dianhydride, 1,2,4,5-naphthalenetetracarboxylic dianhydride, 2,6-dichloronaphthalene-1,4,5,8-tetracarboxylic dianhydride, 2,7-dichloronaphthalene-1,4,5,8-tetracarboxylic dianhydride, 2,3,6,7-tetrachloronaphthalene-1,4,5,8-tetracarboxylic dianhydride, phenanthrene-1,8,9,10-tetracarboxylic dianhydride, pyrazine-2,3,5,6-tetracarboxylic dianhydride, thiophene-2,3,5,6-tetracarboxylic dianhydride, 2,3,3',4'-biphenyltetracarboxylic dianhydride, 3,4,3',4'-biphenyltetracarboxylic dianhydride, 2,3,2',3'-biphenyltetracarboxylic dianhydride, bis(3,4-dicarboxyphenyl)dimethylsilane dianhydride, bis(3,4-dicarboxyphenyl)methylphenylsilane dianhydride, bis(3,4-dicarboxyphenyl)diphenylsilane dianhydride, 1,4-bis(3,4-dicarboxyphenyldimethylsilyl)benzene dianhydride, 1,3-bis(3,4-dicarboxyphenyl)-1,1,3,3-tetramethyldicyclohexane dianhydride, p-phenylenebis(trimellitateanhydride), ethylenetetracarboxylic dianhydride, 1,2,3,4-butanetetracarboxylic dianhydride, decahydronaphthalene-1,4,5,8-tetracarboxylic dianhydride, 4,8-dimethyl-1,2,3,5,6,7-hexahydronaphthalene-1,2,5,6-tetracarboxylic dianhydride, cyclopentane-1,2,3,4-tetracarboxylic dianhydride, pyrrolidine-2,3,4,5-tetracarboxylic dianhydride, 1,2,3,4-cyclobutanetetracarboxylic dianhydride, bis(exo-bicyclo[2,2,1]heptane-2,3-dicarboxylic dianhydride, bicyclo-[2,2,2]-oct-7-ene-2,3,5,6-tetracarboxylic dianhydride, 2,2-bis(3,4-dicarboxyphenyl)propane dianhydride, 2,2-bis[4-(3,4-dicarboxyphenyl)phenyl]propane dianhydride, 2,2-bis(3,4-dicarboxyphenyl)hexafluoropropane dianhydride, 2,2-bis[4-(3,4-dicarboxyphenyl)phenyl]hexafluoropropane dianhydride, 4,4'-bis(3,4-dicarboxyphenoxy)diphenyl sulfide dianhydride, 1,4-bis(2-hydroxyhexafluoroisopropyl)benzenebis(trimellitic anhydride), 1,3-bis(2-hydroxyhexafluoroisopropyl)benzenebis(trimellitic anhydride), 5-(2,5-dioxotetrahydrofuryl)-3-methyl-3-cyclohexene-1,2-dicarboxylic dianhydride and tetrahydrofuran-2,3,4,5-tetracarboxylic dianhydride.

Particularly preferred are tetracarboxylic dianhydrides represented by the following chemical formulas (V) and (VI), in order to impart satisfactory solubility in solvents. In this case, the proportion of the tetracarboxylic dianhydride represented by these formulas is preferably at least 50 mol % with respect to 100 mol % as the total tetracarboxylic dianhydride. A proportion of less than 50 mol % will tend to reduce the solubility-improving effect.

[Chemical Formula 5]

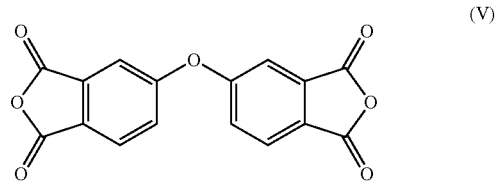

(V)

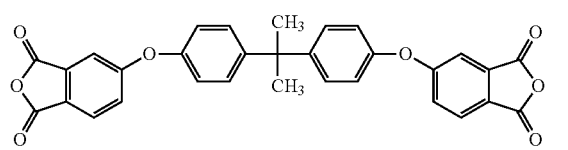

(VI)

These tetracarboxylic dianhydrides may be used alone or in combinations of two or more. For adjustment of the solubility in alkali developing solutions and the molecular weight, a monofunctional acid anhydride such as trimellitic anhydride may also be combined therewith if necessary.

A radiation-polymerizable compound is a compound that polymerizes upon exposure to radiation such as ultraviolet rays or an electron beam. The radiation-polymerizable compound is preferably a compound with an ethylenic unsaturated group such as an acrylate or methacrylate group. As specific examples of radiation-polymerizable compounds there may be mentioned methyl acrylate, methyl methacrylate, ethyl acrylate, ethyl methacrylate, butyl acrylate, butyl methacrylate, 2-ethylhexyl acrylate, 2-ethylhexyl methacrylate, pentenyl acrylate, tetrahydrofurfuryl acrylate, tetrahydrofurfuryl methacrylate, diethyleneglycol diacrylate, triethyleneglycol diacrylate, tetraethyleneglycol diacrylate, diethyleneglycol dimethacrylate, triethyleneglycol dimethacrylate, tetraethyleneglycol dimethacrylate, trimethylolpropane diacrylate, trimethylolpropane triacrylate, trimethylolpropane dimethacrylate, trimethylolpropane trimethacrylate, 1,4-butanediol diacrylate, 1,6-hexanediol diacrylate, 1,4-butanediol dimethacrylate, 1,6-hexanediol dimethacrylate, pentaerythritol triacrylate, pentaerythritol tetraacrylate, pentaerythritol trimethacrylate, pentaerythritol tetramethacrylate, dipentaerythritol hexaacrylate, dipentaerythritol hexamethacrylate, styrene, divinylbenzene, 4-vinyltoluene, 4-vinylpyridine, N-vinylpyrrolidone, 2-hydroxyethyl acrylate, 2-hydroxyethyl methacrylate, 1,3-acryloyloxy-2-hydroxypropane, 1,2-methacryloyloxy-2-hydroxypropane, methylenebisacrylamide, N,N-dimethylacrylamide, N-methylolacrylamide, triacrylates of tris(β-hydroxyethyl)isocyanurate, compounds represented by the following general formula (10), urethane acrylates or urethane methacrylates, and urea acrylates. In formula (10), $R^3$ and $R^4$ each independently represent hydrogen or a methyl group, and q and r each independently represent an integer of 1 or greater.

In formula (21), s represents 0 or 1 and $R^5$ represents a C1-30 divalent or trivalent organic group. In formula (22), $R^6$ represents hydrogen or a methyl group, and $R^7$ represents an ethylene or propylene group.

A urea methacrylate is produced, for example, by reaction of a diamine represented by the following general formula (31) and a compound represented by the following general formula (32).

[Chemical Formula 8]

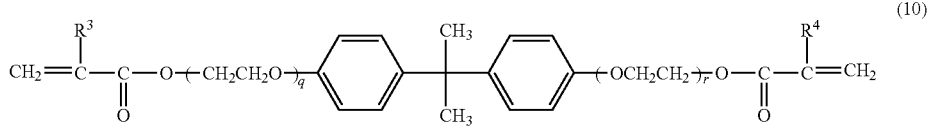

In formula (31), $R^8$ represents a C2-30 divalent organic group. In formula (32), t represents 0 or 1.

In addition to these compounds, there may be used radiation-polymerizable copolymers having ethylenic unsaturated groups on side chains, which are obtained by addition reaction of a compound having at least one ethylenic unsaturated group and a functional group such as an oxirane ring or an isocyanate, hydroxyl or carboxyl group, with a functional group-containing vinyl copolymer.

These radiation-polymerizable compounds may be used alone or in combinations of two or more. Among them, radiation-polymerizable compounds represented by general formula (10) above are preferred from the standpoint of imparting solvent resistance after curing, and urethane acrylates and urethane methacrylates are preferred from the standpoint of imparting flexibility after curing.

The molecular weight of the radiation-polymerizable compound is preferably not greater than 2000. A molecular

[Chemical Formula 6]

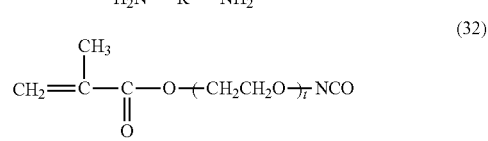

Urethane acrylates and urethane methacrylates are produced, for example, by reaction of diols, isocyanate compounds represented by the following general formula (21) and compounds represented by the following general formula (22).

[Chemical Formula 7]

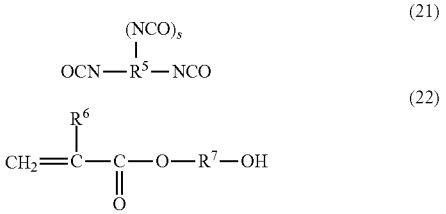

weight of greater than 2000 will tend to lower the solubility of the photosensitive adhesive in alkali developing solutions, while also lowering the tack of the adhesive film and hampering low temperature attachment to adherends such as semiconductor wafers.

The radiation-polymerizable compound content is preferably 5-250 parts by mass and more preferably 20-200 parts by mass with respect to 100 parts by mass of the alkali-soluble polymer. A radiation-polymerizable compound content of greater than 250 parts by mass will tend to lower the adhesion property after thermocompression bonding and increase warping, as a result of the polymerized radiation-polymerizable compound. A content of less than 5 parts by mass will tend to lower the solvent resistance after light exposure, thus interfering with formation of the pattern.

A heat radical generator may be used if necessary to increase the thermosetting property after light exposure and re-adhesion.

The photopolymerization initiator preferably has an absorption band of 300-400 nm in order to improve the sensitivity during pattern formation. As specific examples of photopolymerization initiators there may be mentioned aromatic ketones such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 2-benzyl-2-dimethylamino-1-(4-morpholinophenyl)-butanone-1,2,2-dimethoxy-1,2-diphenylethan-1-one, 1-hydroxy-cyclohexyl-phenyl-ketone, 2-methyl-1-(4-(methylthio)phenyl)-2-morpholinopropanone-1,2,4-diethylthioxanthone, 2-ethylanthraquinone and phenanthrenequinone, benzoinethers such as benzoinmethyl ether, benzoinethyl ether and benzoinphenyl ether, benzoins such as methylbenzoin and ethylbenzoin, benzyl derivatives such as benzyldimethylketal, 2,4,5-triarylimidazole dimers such as 2-(o-chlorophenyl)-4,5-diphenylimidazole dimer, 2-(o-chlorophenyl)-4,5-di(m-methoxyphenyl)imidazole dimer, 2-(o-fluorophenyl)-4,5-phenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer and 2-(2,4-dimethoxyphenyl)-4,5-diphenylimidazole dimer, acridine derivatives such as 9-phenylacridine and 1,7-bis(9,9'-acridinyl)heptane, and bisacylphosphine oxides such as bis(2,6-dimethoxybenzoyl)-2,4,4-trimethyl-pentylphosphine oxide and bis(2,4,6,-trimethylbenzoyl)-phenylphosphine oxide. These may be used alone or in combinations of two or more.

The amount of the photopolymerization initiator is not particularly restricted, but it may usually be 0.01-30 parts by mass with respect to 100 parts by mass of the alkali-soluble polymer.

The photosensitive adhesive preferably further comprises a thermosetting resin. A thermosetting resin, for the purpose of the present specification, is a reactive compound that can undergo crosslinking reaction by heat. As examples of such compounds there may be mentioned epoxy resins, cyanate resins, bismaleimide resins, phenol resins, urea resins, melamine resins, alkyd resins, acrylic resins, unsaturated polyester resins, diallyl phthalate resins, silicone resins, resorcinol-formaldehyde resins, xylene resins, furan resins, polyurethane resins, ketone resins, triallyl cyanurate resins, polyisocyanate resins, tris(2-hydroxyethyl)isocyanurate-containing resins, triallyl trimellitate-containing resins, thermosetting resins synthesized from cyclopentadienes, and thermosetting resins obtained by trimerization of aromatic dicyanamides. Among these, epoxy resins, cyanate resins and bismaleimide resins are preferred from the viewpoint of imparting excellent adhesive force at high temperature, and epoxy resins are particularly preferred for their manageability and their thermal reactivity in context of the thermal history during assembly of semiconductor devices. These thermosetting resins may be used alone or in combinations of two or more.

The epoxy resin is preferably a compound with at least two epoxy groups in the molecule. From the viewpoint of curability and cured properties, it is extremely preferably a phenol glycidyl ether-type epoxy resin. As examples of such epoxy resins there may be mentioned glycidyl ethers of bisphenol A, AD, S or F, glycidyl ether of hydrogenated bisphenol A, glycidyl ethers of bisphenol A ethylene oxide adducts, glycidyl ethers of bisphenol A propylene oxide adducts, glycidyl ethers of phenol-novolac resins, glycidyl ethers of cresol-novolac resins, glycidyl ethers of bisphenol A-novolac resins, glycidyl ethers of naphthalene resins, trifunctional or tetrafunctional glycidyl ethers, glycidyl ethers of dicyclopentadienephenol resins, glycidyl esters of dimer acids, trifunctional or tetrafunctional glycidylamines, and glycidylamines of naphthalene resins. These may be used alone or in combinations of two or more.

As examples of cyanate resins there may be mentioned 2,2'-bis(4-phenyl cyanate)isopropylidene, 1,1'-bis(4-phenyl cyanate)ethane, bis(4-cyanate-3,5-dimethylphenyl)methane, 1,3-bis[4-phenyl cyanate-1-(1-methylethylidene)]benzene, cyanate phenol-dicyclopentanediene adducts, phenol novolac cyanate ester, bis(4-phenyl cyanate)thioether, bis(4-phenyl cyanate)ether, resorcinol dicyanate, 1,1,1-tris(4-phenyl cyanate)ethane and 2-phenyl-2-(4-phenyl cyanate)isopropylidene. These may be used alone or in combinations of two or more.

As examples of bismaleimide resins there may be mentioned o-, m- or p-bismaleimidebenzene, 4-bis(p-maleimidecumyl)benzene, 1,4-bis(m-maleimidecumyl)benzene, and maleimide compounds represented by the following general formulas (40), (41), (42) and (43). These may be used alone or in combinations of two or more.

[Chemical Formula 9]

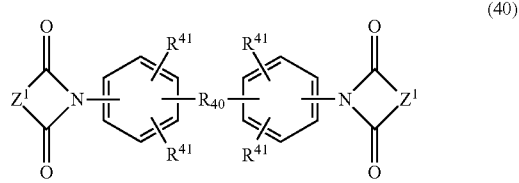

(40)

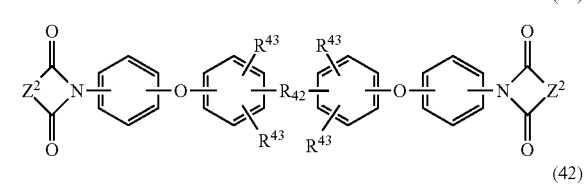

(41)

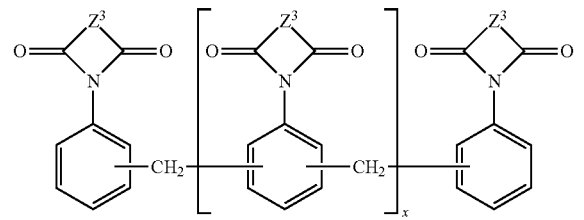

(42)

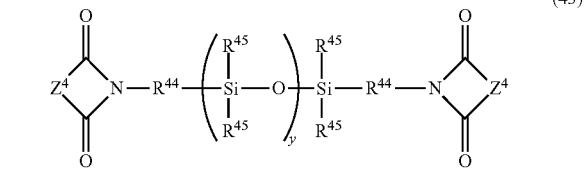

(43)

In formula (40), $R^{40}$ represents —O—, —CH$_2$—, —CF$_2$—, —SO$_2$—, —S—, —CO—, —C(CH$_3$)$_2$— or —C(CF$_3$)$_2$—, the four $R^{41}$ groups each independently represent hydrogen, lower alkyl, lower alkoxy, fluorine, chlorine or bromine, and the two $Z^1$ groups each independently represent a dicarboxylic acid residue with an ethylenic unsaturated double bond.

In formula (41), $R^{42}$ represents —O—, —CH$_2$—, —CF$_2$—, —SO$_2$—, —S—, —CO—, —C(CH$_3$)$_2$— or —C(CF$_3$)$_2$—, the four $R^{43}$ groups each independently represent hydrogen, lower alkyl, lower alkoxy, fluorine, chlorine or bromine, and the two $Z^2$ groups each independently represent a dicarboxylic acid residue with an ethylenic unsaturated double bond.

In formula (42), x represents an integer of 0-4, and the multiple $Z^3$ groups each independently represent a dicarboxylic acid residue with an ethylenic unsaturated double bond.

In formula (43), the two $R^{44}$ groups each independently represent a divalent hydrocarbon group, the multiple $R^{45}$ groups each independently represent a monovalent hydrocarbon group, the two $Z^4$ groups each independently represent a dicarboxylic acid residue with an ethylenic unsaturated double bond, and y represents an integer of 1 or greater.

$Z^1$, $Z^2$, $Z^3$ and $Z^4$ in formulas (40)-(43) may be maleate residues, citraconate residues or the like.

As examples of bismaleimide resins represented by formula (41) there may be mentioned 4,4-bismaleimidediphenyl ether, 4,4-bismaleimidediphenyl methane, 4,4-bismaleimide-3,3'-dimethyl-diphenyl methane, 4,4-bismaleimidediphenyl sulfone, 4,4-bismaleimidediphenyl sulfide, 4,4-bismaleimidediphenylketone, 2'-bis(4-maleimidephenyl) propane, 4-bismaleimidediphenyl fluoromethane and 1,1,1,3,3,3-hexafluoro-2,2-bis(4-maleimidephenyl)propane.

As examples of bismaleimide resins represented by formula (42) there may be mentioned bis[4-(4-maleimidephenoxy)phenyl]ether, bis[4-(4-maleimidephenoxy)phenyl] methane, bis[4-(4-maleimidephenoxy)phenyl] fluoromethane, bis[4-(4-maleimidephenoxy)phenyl]sulfone, bis[4-(3-maleimidephenoxy)phenyl]sulfone, bis[4-(4-maleimidephenoxy)phenyl]sulfide, bis[4-(4-maleimidephenoxy) phenyl]ketone, 2-bis[4-(4-maleimidephenoxy)phenyl]propane and 1,1,1,3,3,3-hexafluoro-2,2-bis[4-(4-maleimidephenoxy)phenyl]propane.

When a thermosetting resin is used, additives such as curing agents, curing accelerators and catalysts may be appropriately added to the photosensitive adhesive for curing. When a catalyst is added, a co-catalyst may also be used if necessary.

When an epoxy resin is used, it is preferred to use a curing agent or curing accelerator for the epoxy resin, and more preferably they are used in combination. As examples of curing agents there may be mentioned phenol-based compounds, aliphatic amines, alicyclic amines, aromatic polyamines, polyamides, aliphatic acid anhydrides, alicyclic acid anhydrides, aromatic acid anhydrides, dicyandiamides, organic acid dihydrazides, boron trifluoride amine complexes, imidazoles, tertiary amines, and phenol-based compounds having at least two phenolic hydroxyl groups in the molecule. Of these, phenol-based compounds having at least two phenolic hydroxyl groups in the molecule are preferred from the viewpoint of excellent solubility in alkali developing solutions.

As examples of phenol-based compounds having at least two phenolic hydroxyl groups in the molecule there may be mentioned phenol-novolac resins, cresol-novolac resins, t-butylphenol-novolac resins, dicyclopentadienecresol-novolac resins, dicyclopentadienephenol-novolac resins, xylylene-modified phenol-novolac resins, naphthol-novolac resins, trisphenol-novolac resins, tetrakisphenol-novolac resins, bisphenol A-novolac resins, poly-p-vinylphenol resins and phenolaralkyl resins.

The curing accelerator is not particularly restricted so long as it accelerates curing of the epoxy resin, and as examples there may be mentioned imidazoles, dicyandiamide derivatives, dicarboxylic acid dihydrazides, triphenylphosphine, tetraphenylphosphonium tetraphenyl borate, 2-ethyl-4-methylimidazole-tetraphenyl borate and 1,8-diazabicyclo[5.4.0] undecene-7-tetraphenyl borate.

The amount of epoxy resin curing agent used is preferably 0-200 parts by mass with respect to 100 parts by mass of the epoxy resin, and the amount of curing accelerator is preferably 0-50 parts by mass with respect to 100 parts by mass of the epoxy resin.

When a cyanate resin is used as the thermosetting resin, it is preferred to use a catalyst, and a co-catalyst as necessary. As examples of catalysts there may be mentioned metal salts and metal complexes of cobalt, zinc, copper and the like, and preferred co-catalysts include phenol-based compounds such as alkylphenols, bisphenol compounds and phenol-novolac resins.

When a bismaleimide resin is used as the thermosetting resin, it is preferred to use a radical polymerizing agent as the curing agent. As examples of radical polymerizing agents there may be mentioned acetylcyclohexylsulfonyl peroxide, isobutyryl peroxide, benzoyl peroxide, octanoyl peroxide, acetyl peroxide, dicumyl peroxide, cumene hydroperoxide and azobisisobutyronitrile. The amount of radical polymerizing agent used in this case is preferably 0.01-1.0 part by mass with respect to 100 parts by mass of the bismaleimide resin.

The photosensitive adhesive may contain a suitable coupling agent for purposes such as increased bonding strength. Silane coupling agents and titanium-based coupling agents may be mentioned as examples of coupling agents, with silane coupling agents being preferred from the viewpoint of imparting high adhesive force.

When a coupling agent is used, the amount is preferably 0-50 parts by mass and more preferably 0-20 parts by mass with respect to 100 parts by mass of the polyimide. An amount exceeding 50 parts by mass will tend to reduce the shelf life of the photosensitive adhesive.

As examples of silane coupling agents there may be mentioned vinyltrimethoxysilane, vinyltriethoxysilane, vinyltris (2-methoxyethoxy)silane, N-(2-aminoethyl) 3-aminopropylmethyldimethoxysilane, N-(2-aminoethyl) 3-aminopropyltrimethoxysilane, 3-aminopropyltriethoxysilane, 3-aminopropyltrimethoxysilane, 3-glycidoxypropyltrimethoxysilane, 3-glycidoxypropylmethyldimethoxysilane, 2-(3,4-epoxycyclohexyl)ethyltrimethoxysilane, 3-isocyanatepropyltriethoxysilane, 3-methacryloxypropyltrimethoxysilane, 3-mercaptopropyltrimethoxysilane, 3-ureidopropyltriethoxysilane, N-(1,3-dimethylbutylidene)-3-(triethoxysilyl)-1-propane amine, N,N'-bis[3-(trimethoxysilyl)propyl]ethylenediamine, polyoxyethylenepropyltrialkoxysilane and polyethoxydimethylsiloxane. These may be used alone or in combinations of two or more.

The photosensitive adhesive may contain a filler. As examples of fillers there may be mentioned metal fillers such as silver powder, gold dust and copper powder, non-metal inorganic fillers such as silica, alumina, boron nitride, titania, glass, iron oxide, aluminum borate and ceramics, and organic fillers such as carbon and rubber-based fillers.

The filler may be selected for use according to the desired function. For example, a metal filler is added to impart conductivity or a thixotropic property to an adhesive film, a non-metal inorganic filler is added to impart low thermal expansion and low hygroscopic properties to an adhesive film, and an organic filler is added to impart toughness to an adhesive film. These metal fillers, non-metal inorganic fillers and organic fillers may be used alone or in combinations of two or more. In cases where a filler is used, mixing and kneading may be accomplished using an appropriate combination of dispersers such as an ordinary stirrer, kneader, triple roll, ball mill or the like.

The amount of a filler when used is preferably not greater than 1000 parts by mass and more preferably not greater than 500 parts by mass with respect to 100 parts by mass of the alkali-soluble polymer. The lower limit is not particularly restricted but will normally be 1 part by mass. If the filler amount exceeds 1000 parts by mass, the adhesion property will tend to be reduced.

The storage elastic modulus of the photosensitive adhesive at 100° C. after light exposure is preferably 0.01-10 MPa. A storage elastic modulus of less than 0.01 MPa will lower resistance to the heat and pressure applied during thermocompression bonding after pattern formation, thus tending to result in crushing of the pattern, while a storage elastic modulus of greater than 10 MPa will lower the re-adhesion property after light exposure, thus tending to increase the temperature required to obtain sufficient adhesive force during thermocompression bonding onto adherends after pattern formation.

The value of the storage elastic modulus can be obtained by measuring the dynamic viscoelasticity of a test piece composed of the light-exposed photosensitive adhesive. The dynamic viscoelasticity is measured under conditions with a temperature-elevating rate of 5° C./min, a frequency of 1 Hz and a measuring temperature of −50° C. to 200° C. The measuring apparatus used may be an RSA-2 Viscoelasticity Analyzer by Rheometrix, for example.

The test piece for dynamic viscoelasticity measurement is typically prepared as follows. First, an adhesive sheet comprising a PET film and an adhesive film with a thickness of approximately 40 μm formed on one surface thereof, is cut to a size of 35 mm×10 mm, and is irradiated with ultraviolet rays from the PET film side using a high precision parallel light exposure device (ORC Manufacturing Co., Ltd.), under conditions with an light exposure dose of 1000 mJ/cm$^2$. Following light exposure, the PET film is peeled off and the test piece is thus obtained.

The storage elastic modulus of the photosensitive adhesive at 260° C. after light exposure and heat curing is preferably 1 MPa or greater. If the storage elastic modulus is less than 1 MPa, it will tend to be difficult to inhibit peeling or destruction during high temperature heating when the semiconductor device obtained using the photosensitive adhesive is mounted on a board by soldering.

The value of the storage elastic modulus can be obtained by measuring the dynamic viscoelasticity of a test piece composed of the light-exposed and heat-cured photosensitive adhesive. The dynamic viscoelasticity is measured under conditions with a temperature-elevating rate of 5° C./min, a frequency of 1 Hz and a measuring temperature of −50° C. to 300° C. The measuring apparatus used may be an RSA-2 Viscoelasticity Analyzer by Rheometrix, for example.

A test piece for measurement of the dynamic viscoelasticity is typically obtained by heat curing the adhesive film in an oven at 160° C. for 3 hours after it has been exposed under the same conditions as those mentioned above for formation of the test piece for dynamic viscoelasticity measurement after light exposure.

The temperature at which the weight reduction of the photosensitive adhesive in thermogravimetric analysis after light exposure and heat curing is 5% (hereunder referred to as "5% weight reduction temperature") is preferably 260° C. or higher. If the 5% weight reduction temperature is below 260° C., it will tend to be difficult to inhibit peeling or destruction during high temperature heating when the semiconductor device obtained using the photosensitive adhesive is mounted on a board by soldering. It will also increase the possibility of contaminating the surrounding material or parts by volatile components generated during heating.

The 5% weight reduction temperature is the temperature at which the weight reduction relative to the initial weight is 5% in thermogravimetric analysis performed under conditions with a temperature-elevating rate of 10° C./min, an air flow rate or 80 mL/min and a measuring temperature of 40° C. to 400° C. The sample for thermogravimetric analysis is prepared by using a mortar to finely crush a light-exposed and heated adhesive film under the same conditions as those described for the storage elastic modulus after light exposure and heat curing. The measuring device used may be an EXSTAR 6300 Simultaneous Thermogravimetric Differential Thermal Analyzer by SII Nanotechnology, Inc., for example.

The properties mentioned above can be achieved by preparing the photosensitive adhesive using the polyimide, radiation-polymerizable compound and photopolymerization initiator, and the thermosetting resin and filler if necessary, and adjusting their types and blending ratio.

The film-like photosensitive adhesive (adhesive film) can be obtained by, for example, a method in which the alkali-soluble polymer, radiation-polymerizable compound, photopolymerization initiator and if necessary other components are mixed in an organic solvent and the mixture is kneaded to prepare a varnish, the varnish layer is formed on a base, and then the varnish layer is dried by heating and the base removed if necessary.

The mixing and kneading can be accomplished by an appropriate combination of dispersing machines such as an ordinary stirrer, kneader, triple roll or ball mill. When a thermosetting resin is used, the drying is carried out at a temperature so that the thermosetting resin does not completely react during drying, and under conditions at which the solvent completely volatilizes. Specifically, the varnish layer is dried by heating, usually at 60-180° C. for 0.1-90 minutes.

The temperature at which the thermosetting resin does not completely react is, specifically, a temperature below the peak temperature for heat of reaction, with measurement using a DSC (for example, a "Model DSC-7" (trade name) by Perkin-Elmer), with a sample amount of 10 mg, a temperature-elevating rate of 5° C./min and a measuring atmosphere of air.

The organic solvent used to prepare the varnish, i.e. the varnish solvent, is not particularly restricted so long as it can uniformly dissolve or disperse the material. As examples there may be mentioned dimethylformamide, toluene, benzene, xylene, methyl ethyl ketone, tetrahydrofuran, ethylcellosolve, ethylcellosolve acetate, dioxane, cyclohexanone, ethyl acetate and N-methyl-pyrrolidinone.

The thickness of the varnish layer is preferably 1-100 μm. A thickness of less than 1 μm will tend to impair the adherend anchoring function, while a thickness of greater than 100 μm will tend to increase the residual volatile components in the obtained adhesive film 1.

The residual volatile content in the adhesive film is preferably not greater than 10% by mass. A residual volatile content of greater than 10% by mass will tend to result in more residual voids in the interior of the adhesive film due to foam formation by volatilization of the solvent during the heating for assembly, thus lowering the moisture-proof reliability. It will also increase the possibility of contaminating the surrounding material or parts by volatile components generated during heating. The residual volatilizing content is calculated by the formula: residual volatile content (% by mass)={(M2−M1)/M1}×100, where M1 is the initial mass of the adhesive film cut to a size of 50 mm×50 mm, and M2 is the mass of the adhesive film after it has been heated for 3 hours in an oven at 160° C.

The base used to form the adhesive film is not particularly restricted so long as it can withstand the drying conditions. For example, a polyester film, polypropylene film, polyethylene terephthalate film, polyimide film, polyetherimide film, polyether naphthalate film or methylpentene film may be used as the base. A film used as the base may also be a multilayer film comprising a combination of two or more different types, and the surface may be treated with a silicone-based or silica-based release agent.

The invention claimed is:

1. A semiconductor device comprising:
    (a) a photosensitive adhesive provided on a circuit surface of a first semiconductor chip, wherein the photosensitive adhesive is patterned by light exposure and development; and
    (b) a second semiconductor chip directly bonded to the patterned photosensitive adhesive without a second adhesive layer, wherein
    the photosensitive adhesive is capable of alkali development and exhibits an adhesion property for an adherend after the photosensitive adhesive has been patterned by light exposure and development.

2. The semiconductor device according to claim 1, wherein the patterned photosensitive adhesive is a buffer coat film.

3. The semiconductor device according to claim 1, wherein the photosensitive adhesive comprises an alkali-soluble polymer, a radiation-polymerizable compound and a photopolymerization initiator.

4. The semiconductor device according to claim 3, wherein the alkali-soluble polymer comprises a carboxyl group or a phenolic hydroxyl group.

5. The semiconductor device according to claim 3, wherein a glass transition temperature of the alkali-soluble polymer is not greater than 150° C.

6. The semiconductor device according to claim 3, wherein the alkali-soluble polymer is a polyimide.

7. The semiconductor device according to claim 6, wherein the polyimide is a polyimide obtained by reacting a tetracarboxylic dianhydride with a diamine including at least one type of aromatic diamine represented by any of the following chemical formulas (I-a), (I-b), (II-a), (II-b) and (II-c),

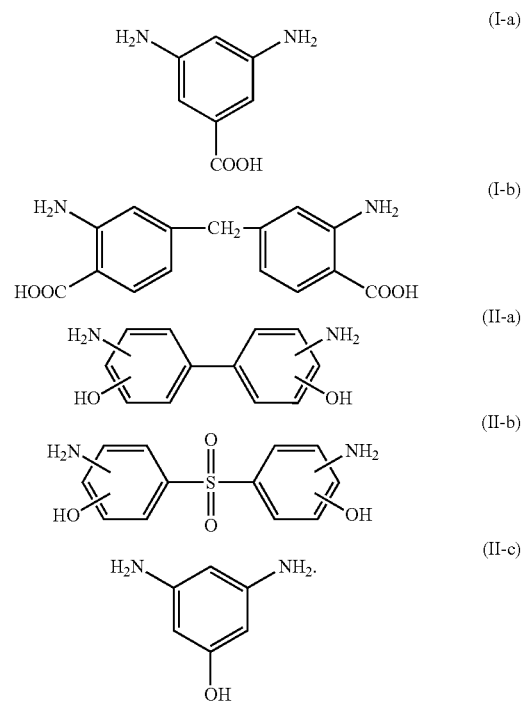

8. The semiconductor device according to claim 3, wherein the photosensitive adhesive further comprises a thermosetting resin.

9. The semiconductor device according to claim 1, wherein the photosensitive adhesive is disposed in the form of a film.

* * * * *